United States Patent
Pan

(10) Patent No.: US 7,307,221 B2
(45) Date of Patent: Dec. 11, 2007

(54) FABRICATION METHOD AND STRUCTURE OF PCB ASSEMBLY, AND TOOL FOR ASSEMBLY THEREOF

(75) Inventor: Chun-Chieh Pan, Taipei (TW)

(73) Assignee: Wistron Corp., Taipei Hsien (TW)

( * ) Notice: Subject to any disclaimer, the term of this patent is extended or adjusted under 35 U.S.C. 154(b) by 246 days.

(21) Appl. No.: 11/100,005

(22) Filed: Apr. 5, 2005

(65) Prior Publication Data

US 2005/0217894 A1    Oct. 6, 2005

(30) Foreign Application Priority Data

Apr. 5, 2004    (TW) .............................. 93109332 A

(51) Int. Cl.
  *H05K 1/16* (2006.01)
(52) U.S. Cl. ...................................... 174/260; 174/261
(58) Field of Classification Search ................ 174/255, 174/260, 261, 266, 250; 257/738, 759, 737; 361/760, 771, 777
See application file for complete search history.

(56) References Cited

U.S. PATENT DOCUMENTS

| | | | | |
|---|---|---|---|---|
| 6,157,079 A | * | 12/2000 | Taguchi | 257/737 |
| 6,569,752 B1 | * | 5/2003 | Homma et al. | 438/597 |
| 2002/0068381 A1 | * | 6/2002 | Ference et al. | 438/108 |

* cited by examiner

*Primary Examiner*—Dean A. Reichard
*Assistant Examiner*—Yuriy Semenenko
(74) *Attorney, Agent, or Firm*—Quintero Law Office

(57) ABSTRACT

A fabrication method and structure for a PCBA, and tool for assembly of the structure. The structure includes a circuit board, at least one first solder joint, a plurality of second solder joints, and an electronic device. The circuit board has a solder mask, having a plurality of openings exposing at least one first pad and a plurality of second pads arranged beyond the first pad, on a surface. The first solder joint has a maximum width J1 and electrically connects to the first pad. The second solder joints respectively have a maximum width J2 exceeding J1 and respectively electrically connect to the second pads. The electronic device has a plurality of third pads, arranged substantially corresponding to the openings, respectively electrically connecting to the first pad and second pads.

5 Claims, 11 Drawing Sheets

FABRICATION METHOD AND STRUCTURE OF PCB ASSEMBLY, AND TOOL FOR ASSEMBLY THEREOF

BACKGROUND

The present invention relates to a fabrication method and structure of a Printed Circuit Board Assembly (PCB Assembly, hereinafter PCBA), and a tool for assembly thereof.

Due to the demand for small-aspect, light and powerful electronic products, it is necessary for a design rule of a semiconductor chip to lay out denser wiring and more devices in a limited area thereof, resulting in increased density and decreased pitch of terminals on the semiconductor chip and/or package thereof. When attaching a BGA (ball grid array) package with terminal pitch of 0.5 mm or less, for example, on a circuit board, alignment therebetween presents extreme difficulty. Although more alignment deviations are acceptable when assembling the BGA package resulting from self-alignment capability of solder balls, acting as terminals, of the BGA package, the acceptable deviation decreases with ball pitch of the BGA package. When ball pitch of the BGA package is 0.5 mm or less, unacceptable alignment deviation between the BGA package and circuit board becomes more often, resulting in solder joint opening and/or short when reflowing the solder balls, thus requires reworking or scraping the circuit board, negatively affecting process yield and cost. Even if solder joints experience neither open nor short, the quality thereof may be negatively affected, resulting in a defect such as decreased joint area, making it impossible for solder joints to form ideal lantern shape. The farther the solder joints from the center of the BGA package, the more the alignment deviation, results in more deterioration of the joint quality. External stress on the outer solder joints increase during shipping, warehousing, and use of the assembled electronic device, accelerating fatigue on the outer solder joints, negatively affecting the reliability of the assembled electronic device.

FIG. 1A is a top view of a PCB 100. The PCB 100 has a solder mask 105 on a surface. The solder mask 105 has a plurality of openings 102 with a width W and being arranged at a pitch P, wherein W is less than P and the pitch is the distance between geometric centers of two neighboring openings 102. A plurality of inner pads 103 and a plurality of outer pads 104 are exposed from the openings 102. The outer pads 104 are arranged beyond the inner pads 103. As shown in FIG. 1A, two lines of solder pads 104 sandwich one line of solder pads 103. The pads 103 and 104 can be SMD (solder mask defined) pads, NSMD (non-solder mask defined) pads, SMD-NSMD combinations thereof, or other types of pads. A closed dash line 106 indicates the predetermined position for attaching an electronic device to the PCB 100 subsequently.

FIG. 1B shows a top view of a conventional tool 150 for applying the solder paste over the PCB 100 using stencil printing method. The tool 150 is a metal plate having a plurality of openings 151 arranged corresponding to pads 103 and 104 of PCB 100. When forming solder paste over the PCB 100, solder volume overlying each pads 103 and 104 may vary. As a result, the volumes of solder joints formed by reflowing the solder paste with the solder balls of the BGA package are different.

Referring to FIG. 2A, the volumes of adjacent solder joints 62 for some pads 103 and 104 are oversized, which may result in solder bridge defects. FIG. 2B shows another possible defect. The outer solder joints 62 are undersized, thus increases the possibility of unsoldering between pads 12 of electronic device 10 and pads 104 of PCB 100, resulting in failure of electrical connection between pads 12 and pads 104. Even if electrical connection is formed between pads 12 and pads 104, the actual connecting area therebetween may be too small to provide sufficient mechanical strength and may affect product reliability.

SUMMARY

Thus, embodiments of the invention provide a fabrication method, fabrication tool, and structure of PCBA, permitting larger alignment deviation during process and enhancing joint strength of outer solder joints thereof, to reduce process cost and improve product reliability.

Embodiments of the invention provide a printed circuit board assembly (PCBA) structure having a circuit board, at least one first solder joint, a plurality of second solder joints, and an electronic device. The circuit board has a solder mask, having a plurality of openings exposing at least one first pad and a plurality of second pads arranged beyond the first pad, on a surface. The first solder joint has a maximum width $J_1$ and electrically connects to the first pad. The second solder joints respectively have a maximum width $J_2$ larger than $J_1$ and respectively electrically connect to the second pads. The electronic device has a plurality of third pads, arranged substantially corresponding to the openings, respectively electrically connecting to the first pad and second pads.

Embodiments of the invention further provide a tool for forming solder paste on a plurality of pads of a circuit board. The tool has a metal plate having at least one first opening and a plurality of second openings respectively arranged beyond and larger than the first opening. The first and second openings arrange substantially corresponding to the pads.

Embodiments of the invention further provide a tool for forming solder paste on a plurality of pads of a circuit board. The tool has a metal plate having at least one first opening and a plurality of second openings respectively arranged beyond the first opening. The first and second openings arrange substantially corresponding to the pads. The first opening is substantially round. The second openings are respectively rounded rectangles.

Embodiments of the invention further provide a PCBA structure having a circuit board and an electronic device. The circuit board has a plurality of first pads and a plurality of second pads arranged beyond the first pads. The electronic device has a plurality of third pads arranged corresponding to the first and second pads. The first pads electrically connect to the corresponding third pads respectively using a first solder joint. The second pads electrically connect to the corresponding third pads respectively using a second solder joint. A first angle between one of the first solder joints and the corresponding first pad exeeds a second angle between one of the second solder joints and the corresponding second pad.

Embodiments of the invention further provide a PCBA structure having a circuit board and an electronic device. The circuit board has a circuit board having a plurality of first pads and a plurality of second pads arranged beyond the first pads. The electronic device has a plurality of third pads arranging as the first and second pads. The first pads electrically connect to the corresponding third pads respectively using a first solder joint. The second pads electrically connect to the corresponding third pads respectively using a second solder joint. The second solder joints are larger than the first solder joints.

Embodiments of the invention further provide a fabrication method for a PCBA structure. First, a circuit board, having a plurality of first pads and a plurality of second pads arranged beyond the first pads, is provided. Then, a tool is disposed overlying the circuit board. The tool has a metal plate, having a plurality of first openings substantially exposing the first pads, and a plurality of second openings substantially exposing the second pads. The second openings are larger than and are beyond the first pads. Next, solder paste is formed overlying every first and second pad using stencil printing. The solder paste overlying the second pads is larger than that overlying the first pads. Next, the tool and circuit board are separated. Next, an electronic device is disposed overlying the circuit board. The electronic device has a plurality of third pads substantially corresponding to the first pads and second pads. The third pads respectively have solder bumps electrically connecting thereto. The solder bumps, substantially equal in size, are respectively disposed on the corresponding solder pastes. Further, the solder bumps and solder paste are reflowed. The solder paste on the first pads and the solder bumps forms a plurality of melted first solder joints. The solder pastes on the second pads and the solder bumps form a plurality of melted second solder joints. The second solder joints exert upward attraction on the electronic device. The first solder joints provide downward pull stress exerting on the electronic device. Finally, the first solder joints and second solder joints are solidified.

BRIEF DESCRIPTION OF THE DRAWINGS

Embodiments of the invention can be more fully understood by reading the subsequent detailed description in conjunction with the examples and references made to the accompanying drawings, wherein.

DETAILED DESCRIPTION OF THE INVENTION

The following embodiments are intended to illustrate the invention more fully without limiting the scope of the claims.

Figure 2A:
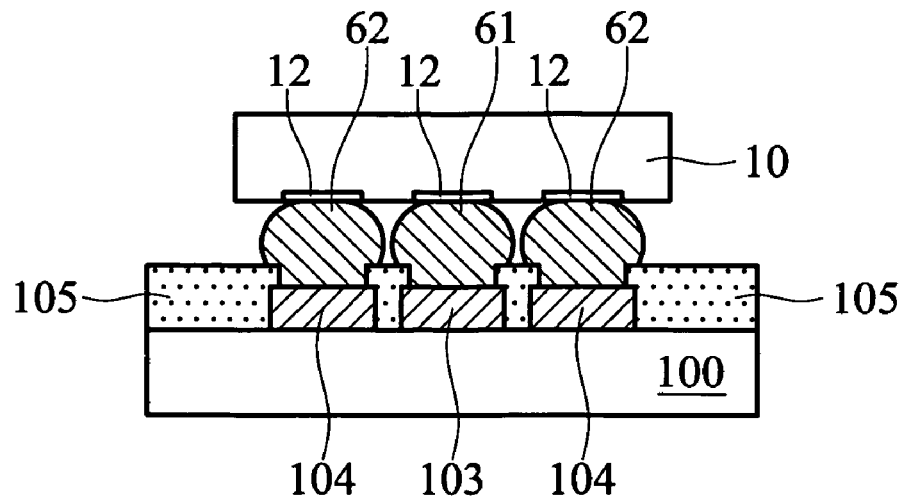
FIG. 2A is a cross-section of a conventional PCBA structure, wherein some solder joints are oversized, which may result in solder bridge defect.
Figure 2B:
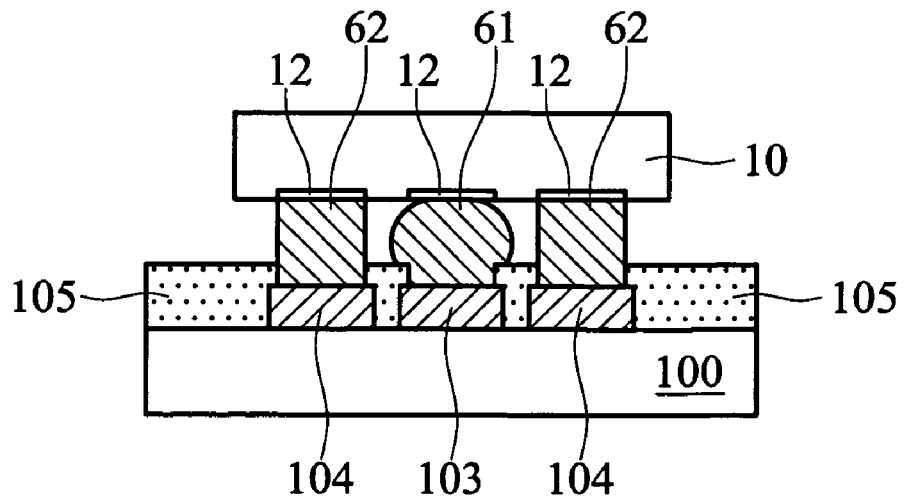
FIG. 2B is a cross-section of a conventional PCBA structure, wherein the outer solder joints are undersized, which may result in unsoldering, failing to electrically connect corresponding pads.
Figure 3:
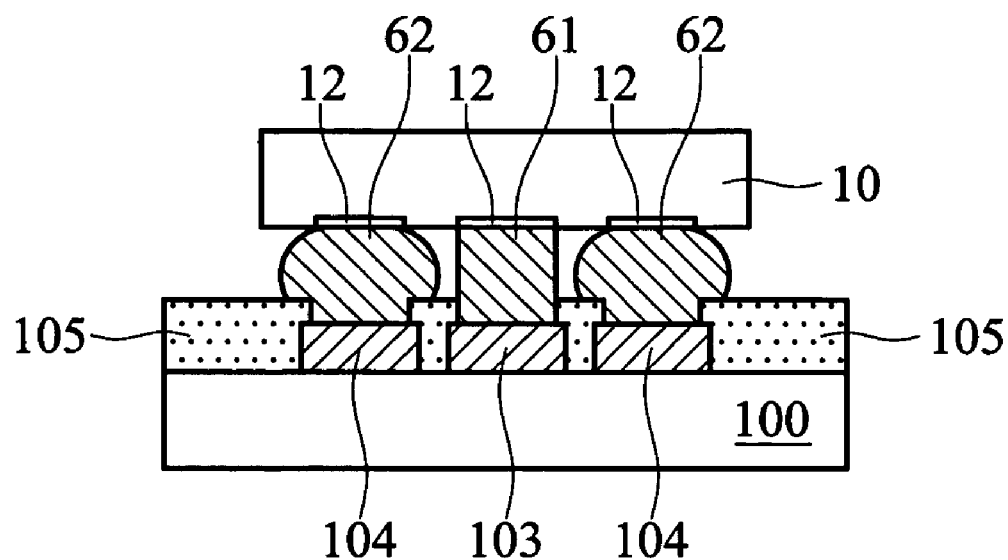
FIG. 3 is a cross-section of a PCBA structure of the present invention.

In FIG. 3, a PCBA structure of one embodiment of the present invention has a PCB 100, at least one first solder joint 61, a plurality of second solder joints 62, and an electronic device 10. The PCB 100 has a solder mask 105 on a surface. The solder mask 105 has a plurality of openings 102 with a width W and being arranged at a pitch P. At least one first pad 103 and a plurality of second pads 104 arranged beyond the first pad 103 are exposed from the openings 102. The first solder joint 61, with a maximum width $J_1$, electrically connects to the first pad 103. The second solder joint 62, with a maximum width $J_2$ wherein $J_1 < J_2$, electrically connects to the second pads 104. The electronic device 10 has a plurality of third pads 12 that are arranged substantially corresponding to the openings 102 and are electrically connected to the corresponding first solder joint 61 or second solder joints 62 respectively. In this embodiment, the distance between adjacent first solder joint 61 and second solder joint 62 is larger than that of the prior-art structure shown in FIG. 2A, thus effectively prevents solder bridging. In addition, the second solder joints 62 located at the outer region are wider, thus provides larger joint areas and improves the interconnecting strength thereof. Because the outer region joints often face higher mechanical stress, better interconnecting strength results in improved product reliability of the PCBA structure.

Figure 4:
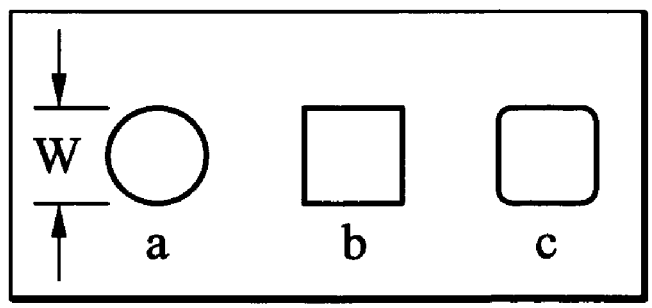
FIG. 4 is a skeleton diagram of possible opening shapes of a tool of the present invention.

In this embodiment, the widths of solder joints 61 and 62 are controlled by adjusting the solder paste volume overlying each pads 103 and 104. Referring to FIG. 4, the opening of a conventional tool is circular with a width W, and the area of this circular opening is $nW^2/4$. In order to increase the volume of attached solder paste by increasing the opening area without affecting the width W, a rectangular opening b with area $W^2$ can be used. Since solder paste may remain in four corners of opening b, a tool of this embodiment provides rounded rectangular openings c, with areas between $nW^2/4$ and $W^2$. The areas of openings c can be controlled by adjustment of the round corners thereof. The solder paste residue problem of the opening b may also be eliminated by other methods, such as truncating four corners of the rectangular opening b to create an octagonal opening. Furthermore, when distances between two openings are not concerned, wider round openings can be used.

Figure 1A:
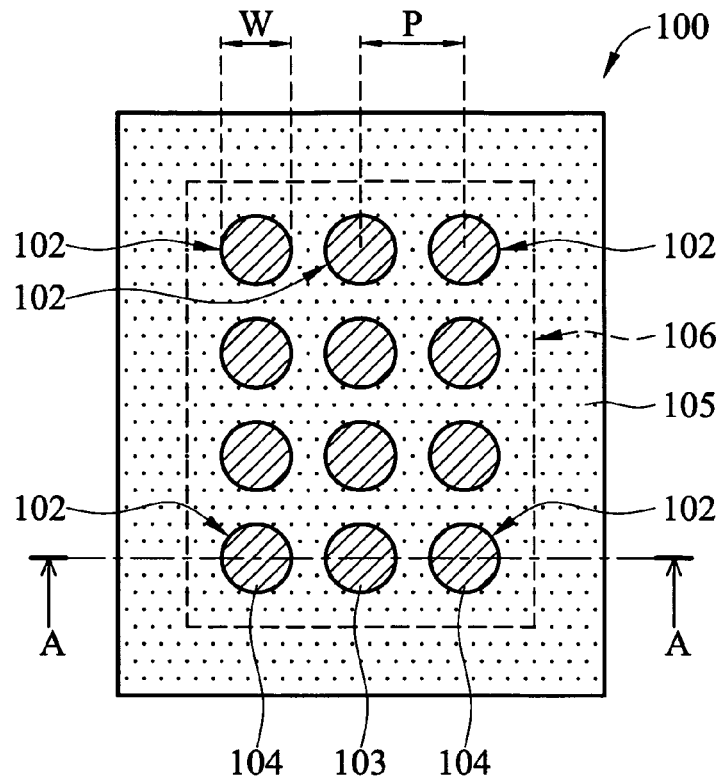
FIG. 1A is a top view of a PCB 100.
Figure 5A:
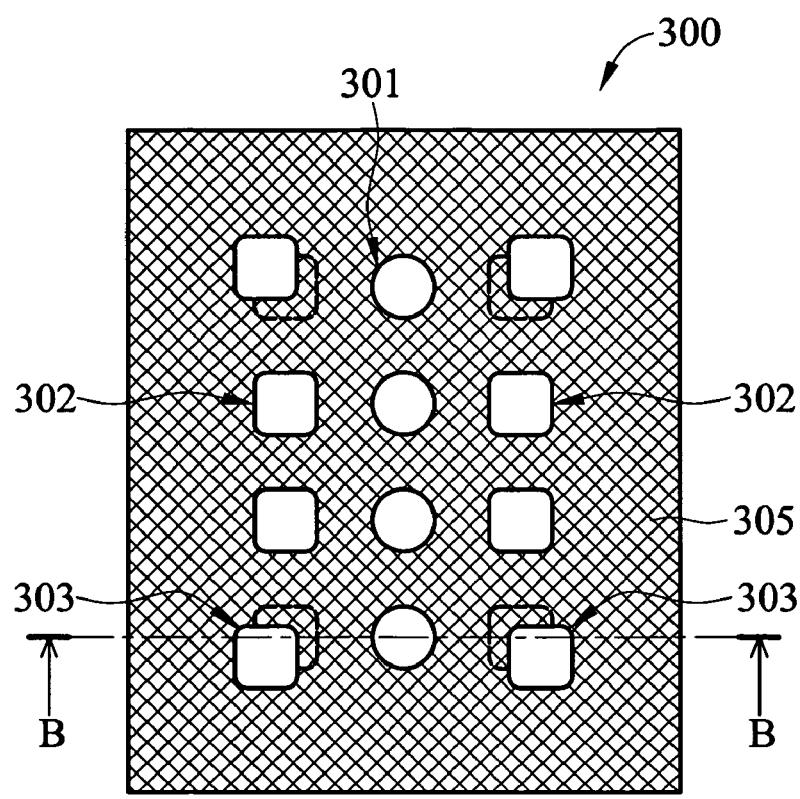
FIG. 5A is a top view of the tool of the present invention.

In FIG. 5A, a tool 300 of one embodiment of the present invention is shown. The tool 300 is designed to overlay solder paste onto the PCB 100 shown in FIG. 1A. The tool has a metal plate 305 having at least one first opening 301 and a plurality of second openings 302 arranged corresponding to the pads of PCB 100 substantially The second openings 302 are located at peripheral region around the first opening 301, and the area of second opening 302 is bigger than that of first opening 301. The first opening 301 is disposed to correspond to the pad 103 for formation of the solder paste thereon. The second openings 302 are disposed to respectively correspond to the pads 104 for formation of the solder pastes thereon.

Figure 5B:
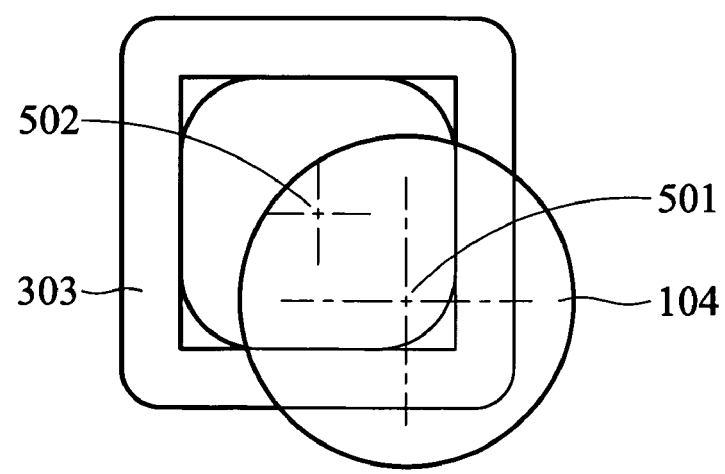
FIG. 5B is a skeleton diagram of a positional relationship between a third opening 303 on the upper-left corner in FIG. 5A and the corresponding pad 104.

During manufacturing process of the PCBA shown in FIG. 3, especially during thermal process such as reflow, oftentimes larger alignment deviation happens in the corner region of the electronic device 10, which results in solder bridge between the second solder joint 62 and its neighboring solder joint 61/62. to avoid such undesired solder bridge, the tool 300 of this embodiment shown in FIG. 5A preferably has third openings 303 located substantially corresponding to the corner second pads 104 for applying the solder paste onto the corner second pads 104. The position of those third openings 303 are shifted slightly outward relative to their corresponding second pads 104. The closed dash lines in FIG. 5A indicate positions perfectly matching the corresponding second pads 104. FIG. 5B shows a positional relation between the third opening 303 and the corresponding second pads 104 at the upper-left corner of the tool 300 in FIG. 5A, in which center 502 is the center of the opening 303 and center 501 is the center of second pad 104. Center 502 of the opening 303 shifts in an upper-left direction relative to the center 501 of the second pad 104. When the opening 303 is substantially 12 mils wide, for example, the displacement thereof can be substantially 2 mils. Accordingly, Solder pastes 50 formed through opening 303 will also shift outwardly. The other third openings 303 also respectively shift in a direction away from the center.

Figure 1B:
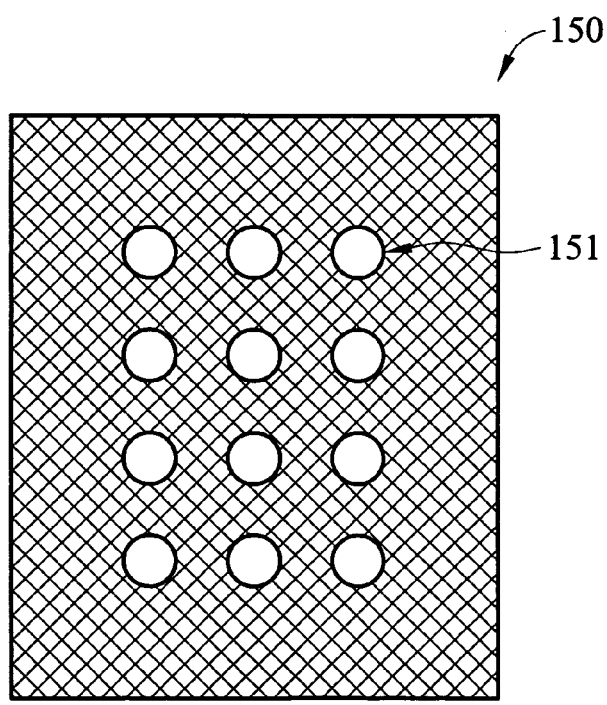
FIG. 1B is a top view of a conventional tool 150.
Figure 6:
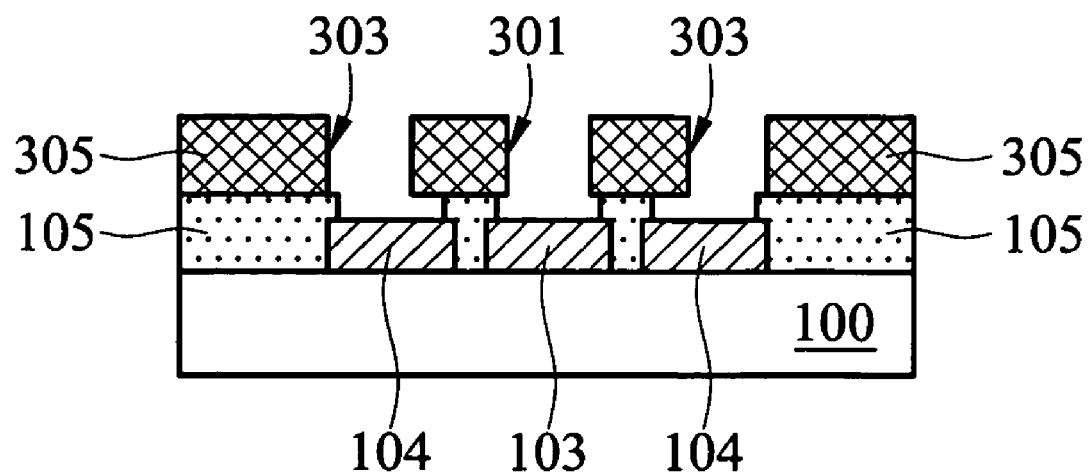
FIG. 6 is a cross-section of a step of aligning tool 300 and PCB 100 of a fabrication method of the present invention.

In FIG. 6, the tool 300 shown in FIG. 5A is aligned with and disposed above a PCB 100. FIG. 6 shows a cross-section of the tool-PCB combination cut along line BB of FIG. 5A or along line AA of FIG. 1.

Figure 7:
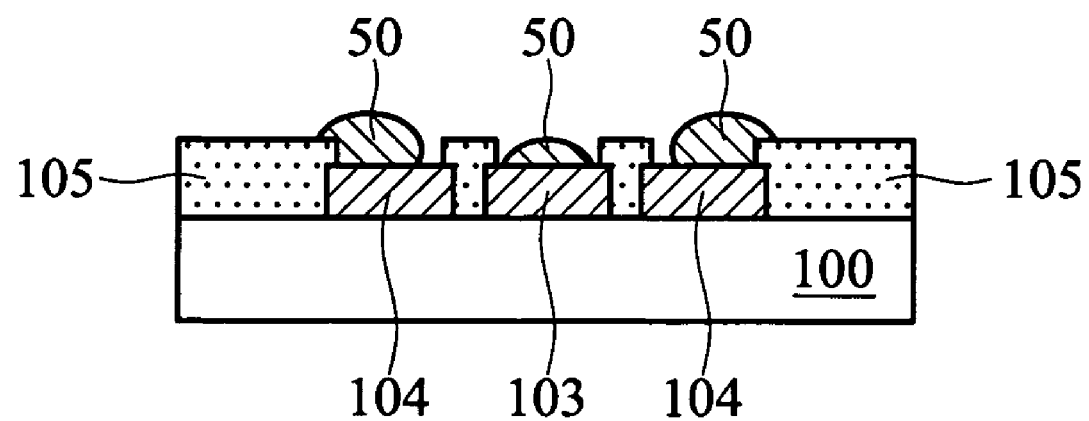
FIG. 7 is a cross-section of a step forming solder paste 50 overlying PCB 100 of the fabrication method of the present invention.

Solder paste is then applied onto PCB 100 through tool 300 using stencil printing, and the tool 300 is removed. In FIG. 7, solder paste 50 is respectively formed overlying pads 103 and 104 of PCB 100. The solder paste volumes overlying the second pads 104 exceed those overlying the first pad 103 because that the third openings 303 of tool 300 are larger than the first openings 301. The two second pads 104 shown in FIG. 7 are at corner position, thus the solder paste 50 overlaid thereon shifts outwardly.

Figure 8:
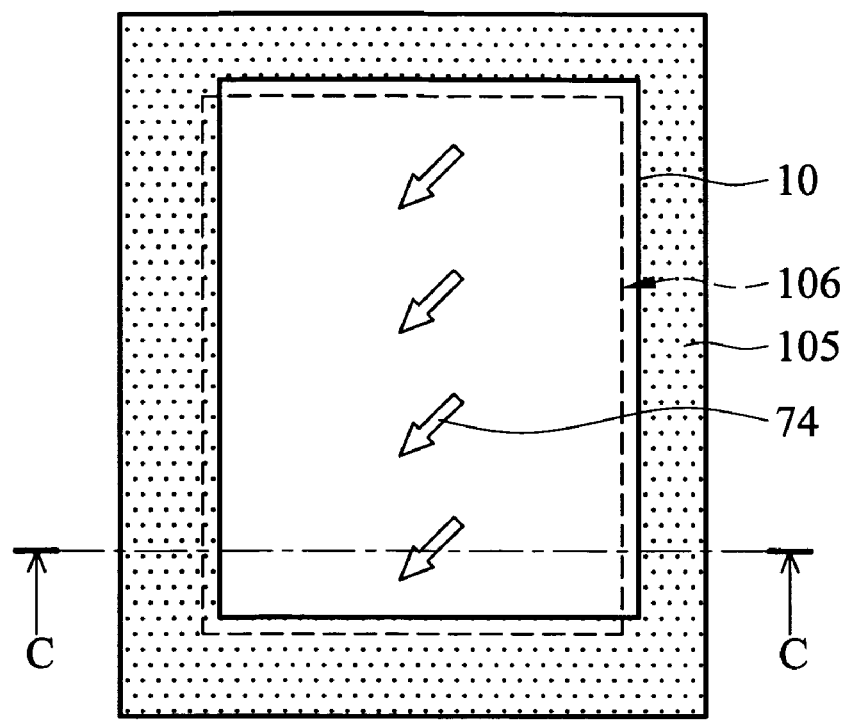
FIG. 8 is a top view illustrating an advantage of the PCBA structure of the present invention during the assembly procedure thereof.
Figure 9:
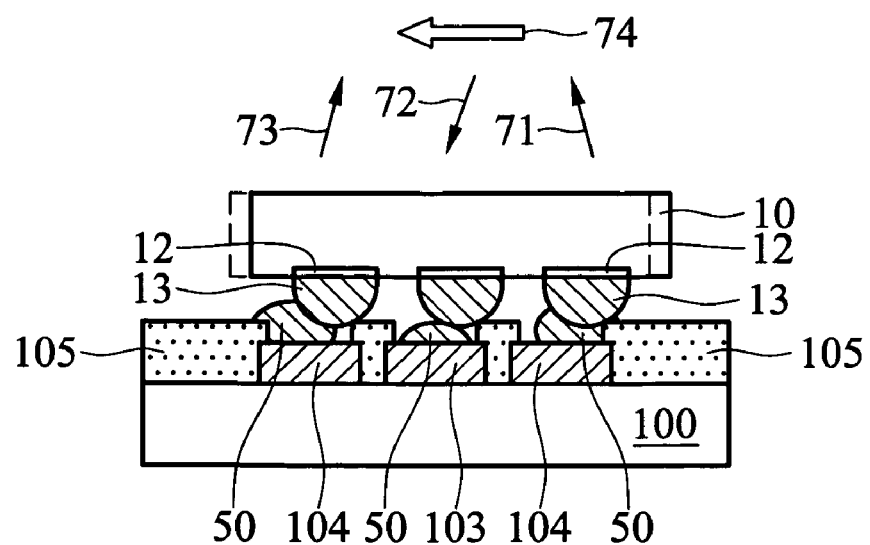
FIG. 9 is a cross-section of FIG. 8 along line CC.

Next an electronic device 10 is disposed on PCB 100 followed by formation of electrical connection therebetween using reflow process to form a PCBA shown in FIG. 3. The electronic device 10 can be a BGA package, WLP (wafer level package), semiconductor chip for flip chip technology, or connector. In FIGS. 8 and 9, the electronic device 10 typically has a plurality of solder bumps 13 with substantially the same dimensions, and a plurality of pads 12 arranged substantially corresponding to pads 103 and 104 of PCB 100. The solder bumps 13 respectively electrically connects to its corresponding pad 12.substantially As seen in FIG. 9, solder bumps 13 are respectively disposed on the corresponding solder pastes 50.

Figure 10A:
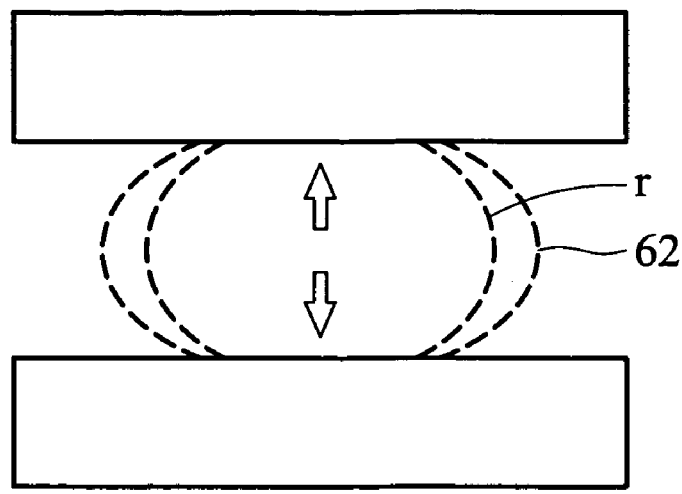
FIG. 10A is a cross-section illustrating the reflow procedure of second solder joints 62 of the present invention.
Figure 10B:
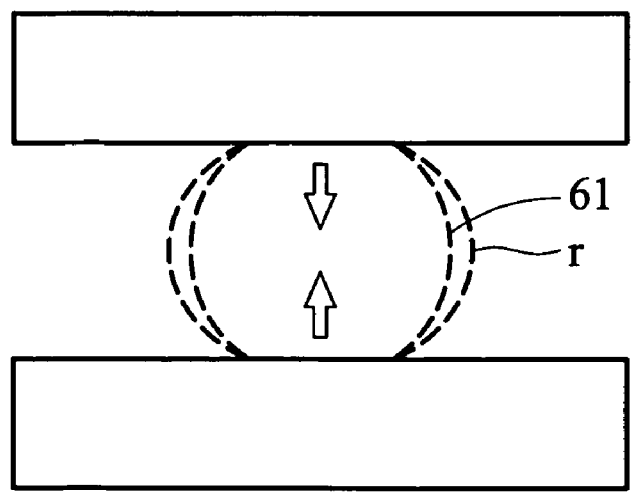
FIG. 10B is a cross-section illustrating the reflow procedure of second solder joints 61 of the present invention.

It is very often that misalignment or mechanical deviation occurs when assembling the electronic device 10 with PCB 100, such as the upper-right shift of electronic device 10 shown in FIG. 8, in which the accurate position is denoted by the dotted line 106. As described previously, alignment of components becomes more difficult as the pitch gets smaller. The PCB assembling method according to this invention also includes self-alignment feature. Using the misalignment of FIGS. 8 and 9 as example, the first solder joints 61 and second solder joints 62, as shown in FIG. 2C, are formed after reflow process. The solder joints 61 and 62 are in fluid state during reflow process, and the self-alignment mechanism is are explained hereunder. In FIG. 10A, a skeleton diagram of one of the melted second solder joints 62 is shown, wherein dash lines r indicate a part of an implied sphere. The melted second solder joints 62 move inward to become spherical as sphere r during reflow resulting from the cohesion thereof. This exerts upward stress on the electronic device 10 as an arrow in FIG. 10A. In FIG. 10B, a skeleton diagram of the melted first solder joints 61 is shown, wherein dash lines r indicate a part of an implied sphere. The melted second solder joint 61 moves outward to become spherical as sphere r during reflow resulting from the cohesion thereof, thus exerting downward attraction on the electronic device 10 as an arrow in FIG. 10B. Thus, the push and pull stresses make the electronic device 10 "float" over the PCB 100.

In FIG. 9, melted solder paste 50 and solder bumps 13 over the outer second pads 104 exert upward stresses on electronic device 10 along directions 71 and 73, and the melted solder paste 50 and solder bumps 13 over the first pad 103 exert downward attraction on electronic device 10 along direction 72, driving and moving the electronic device to the desired position 106 along a direction 74. Finally, the first solder joint 61 and second solder joints are solidified, achieving the PCBA structure shown in FIG. 3. Thus, fabrication of the PCBA structure of the present invention permits more alignment deviation between the electronic 10 and PCB 100, improving the solder joint opening and/or short problems in the known art, especially when pitches P between openings 102 (shown in FIG. 1A) are 0.5 mm or less.

The ratio of the maximum width $J_2$ of the second solder joints 62 to maximum width $J_1$ of the first solder joint 61 is preferably between 1.05 and 1.50, resulting in the second solder joints 62 being wider and sufficiently lantern-shaped to provide more joint areas and higher joint strengths and prevent solder bridge problems, thereby reducing the process cost and improving process yield of the PCBA structure of the present invention. The wider second solder joints 62 further resist more fatigue against cycling external stress exerted thereon during transportation, warehousing, and use, thereby further improving product reliability.

Figure 11:
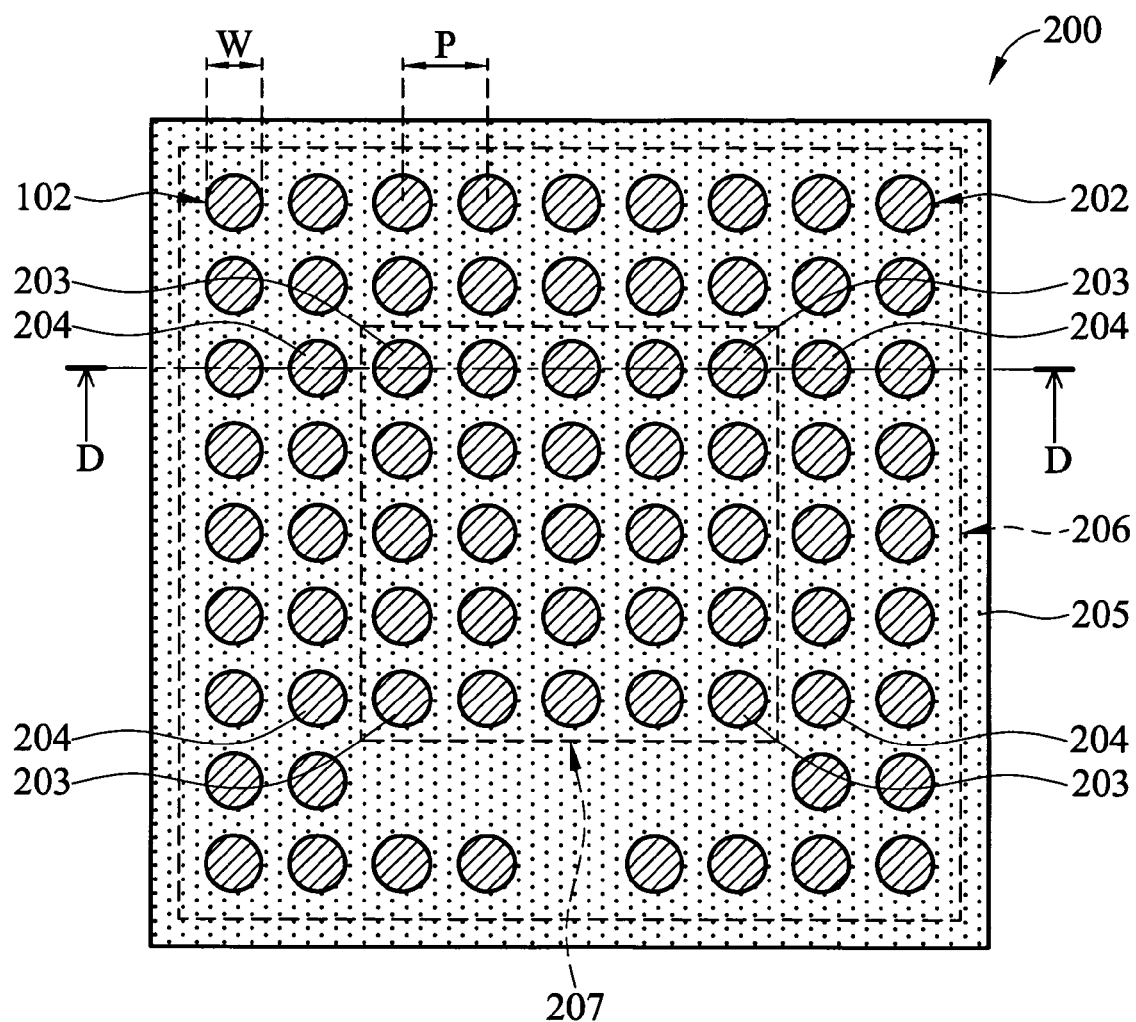
FIG. 11 is a top view of a PCB 200 of the second embodiment of the present invention.

In FIG. 11, a top view of a PCB 200 of the second embodiment of the present invention is shown. Details regarding the solder mask 205, openings 202, first pads 203, and second pads 204 are the same as those of the solder mask 105, openings 102, first pad 103, and second pads 104 in the first embodiment, and thus, are omitted herefrom. The first pads 203 are arranged in the closed dash line 207, and the second pads 204 between closed dash lines 207 and 206, beyond the first pads 203. The closed dash line 206 further indicates a desired position of an electronic device subsequently attached to the PCB 200.

Figure 12:
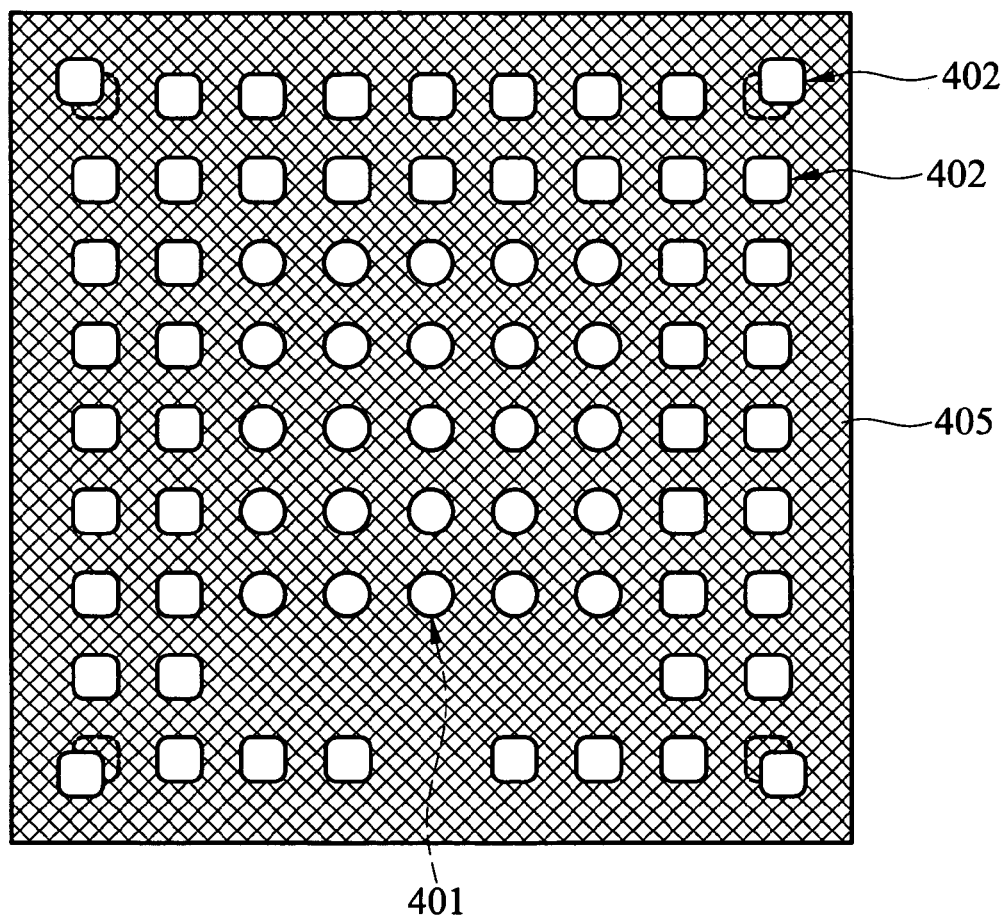
FIG. 12 is a top view of a tool of the second embodiment of the present invention.

In FIG. 12, a top view of a tool for forming solder paste overlying PCB 200 to form a PCBA structure of the second embodiment of the present invention (shown in FIG. 13) is shown. Details regarding the metal plate 405, first openings 401, and second openings 402 are the same as those of the metal plate 305, first openings 301, and second openings 302 in the first embodiment, and thus, are omitted herefrom. The second openings 402 in four corners shift outwardly as the third openings 303 shown in FIG. 5A.

Figure 13:
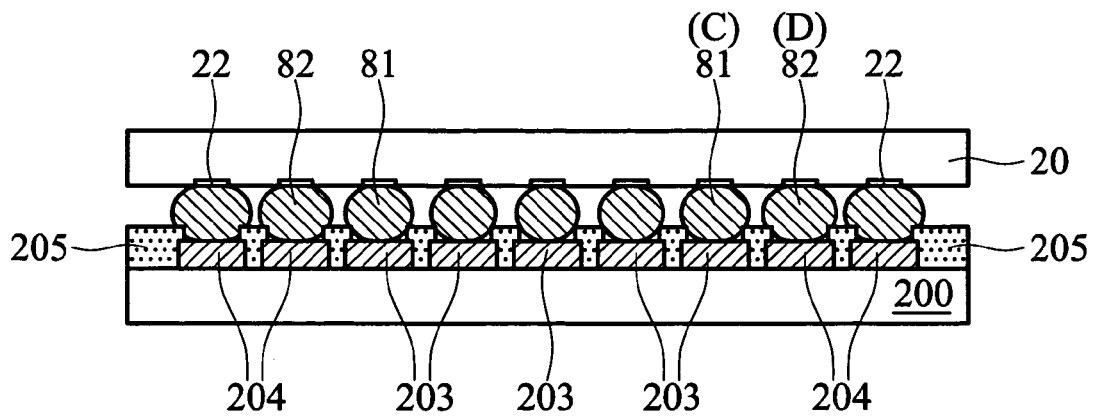
FIG. 13 is a cross-section of a PCBA structure of the second embodiment of the present invention.

FIG. 13 is a cross-section of the PCBA structure of the second embodiment of the present invention. The cross-section of PCB 200 is along line DD in FIG. 11. Details regarding the electronic device 20, pads 22, first solder joints 81, and second solder joints 82 are the same as those of the electronic device 10, pads 12, first solder joint 61, and second solder joints 62 in the first embodiment, and thus, are omitted herefrom.

Figure 14A:
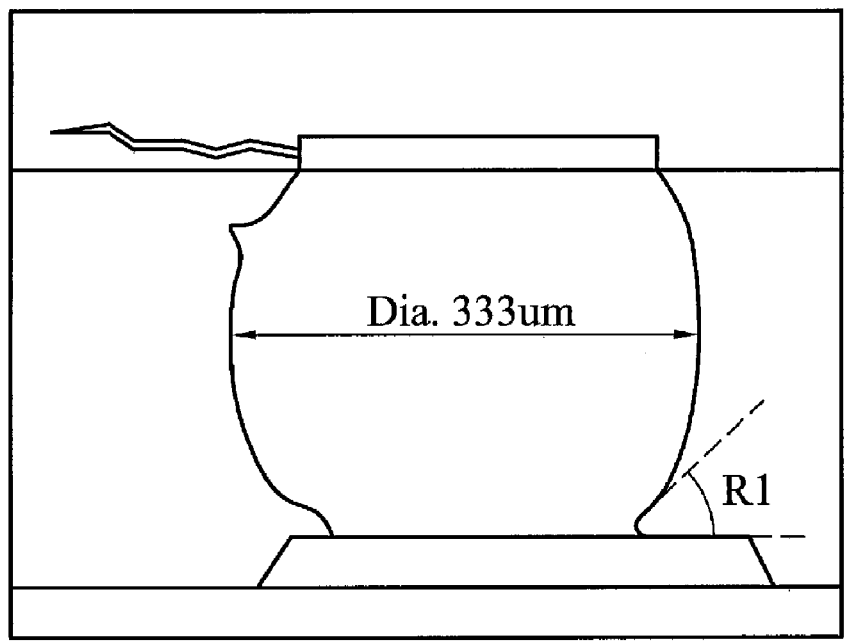
FIG. 14A is a line drawing copy of a microscopic photograph of a solder joint 81 masked (C) in FIG. 13.
Figure 14B:
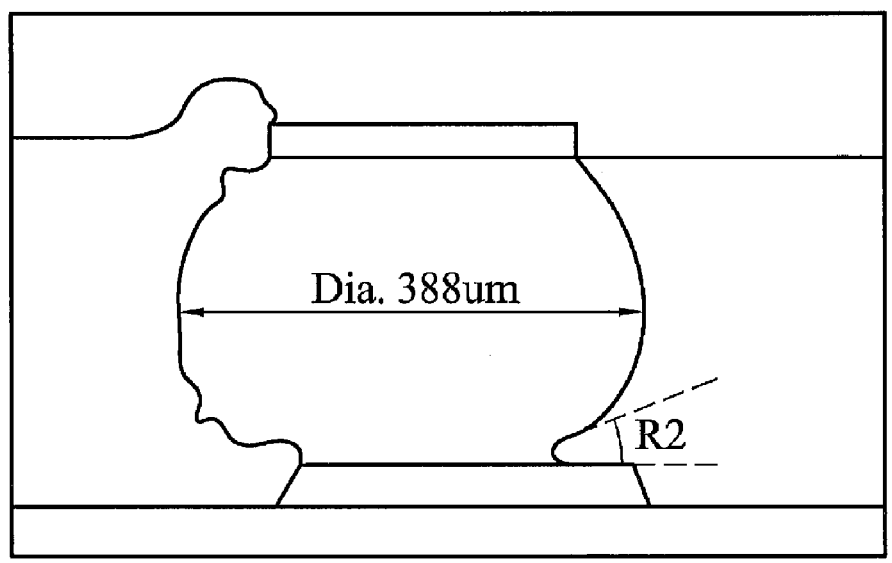
FIG. 14B is a line drawing copy of a microscopic photograph of a solder joint 82 masked (D) in FIG. 13.

In FIGS. 14A and 14B, line drawing copies of microscopic photographs of the first solder joint 81 marked (c) and second solder joint 82 marked (D) in FIG. 13 are shown. The pitch P is substantially 0.5 mm (500 μm), a maximum diameter (a maximum width in FIG. 14A) of first solder joint 81 is substantially 333 μm, a maximum diameter (a maximum width in FIG. 14B) of first solder joint 81 is substantially 388 μm. The ratio of the maximum width J2 of first solder joint 81 to the maximum width J1 of first solder joint 81 (J2/J1) is substantially 1.17, one of the examples. Further, a fillet angle R1 between the first solder joint 81 and first pad 203 is larger than a fillet angle R2 between the second solder joint 82 and second pad 204.

Figure 15:
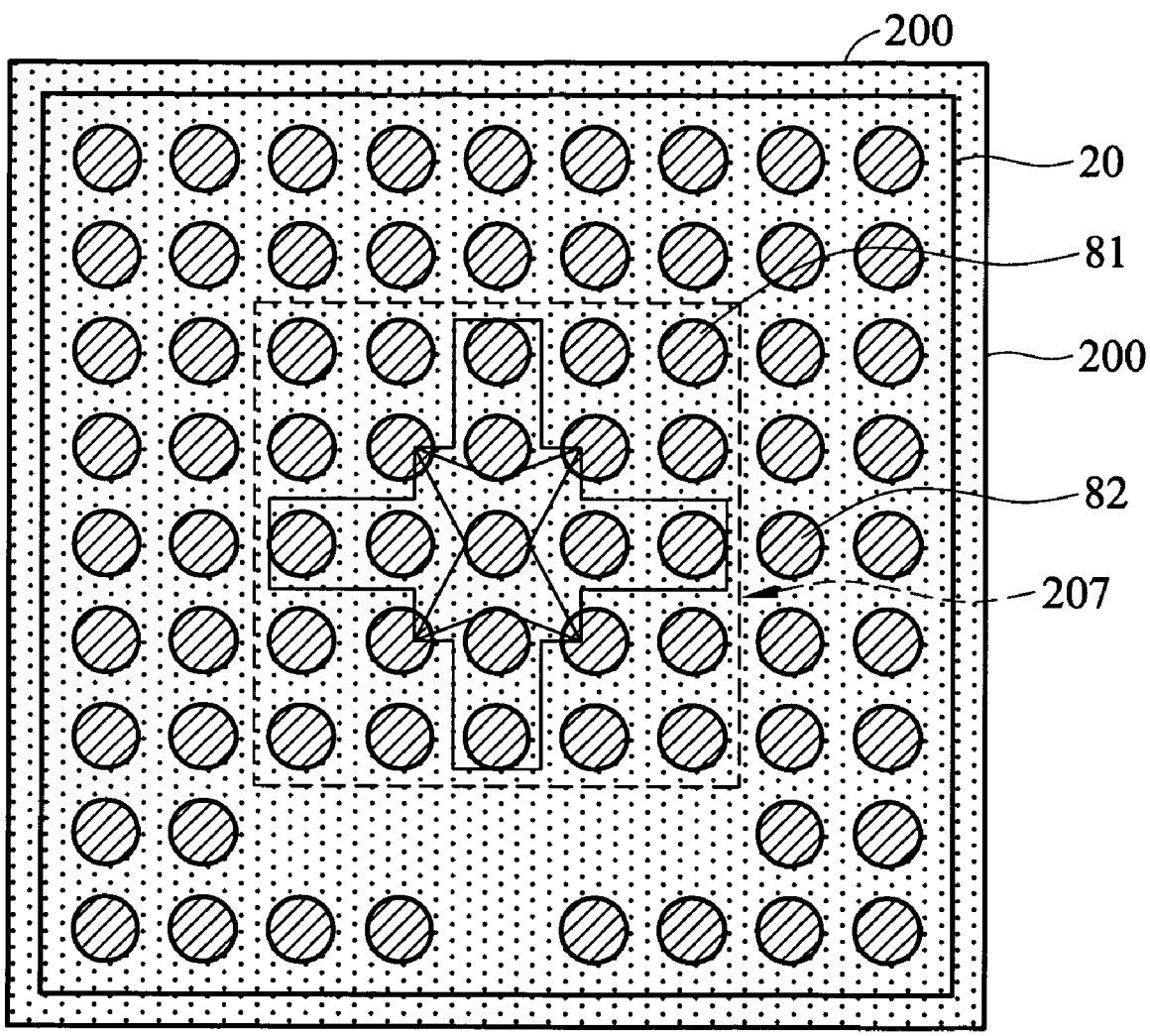
FIG. 15 is a skeleton diagram of stress distribution on an electronic device 20 during reflow.

In FIG. 15, a skeleton diagram of stress distribution on the electronic device 20 during reflow is shown. The first solder joints 81 in the closed dash line 207 exert downward attraction to drive the electronic device 20 (shown transparently) moving to the center of the PCB 200 as the arrows. The outer second solder joints 82 exert upward stress to support and float the electronic device 20.

Although the present invention has been particularly shown and described with reference to the preferred specific embodiments and examples, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A printed circuit board assembly (PCBA) structure, comprising:
   a circuit board comprising a solder mask on a surface, the solder mask comprising a plurality of openings exposing at least one first pad and a plurality of second pads arranged beyond the first pad, wherein the sizes of the first and second pads exposed by the openings are substantially the same;
   at least one first solder joint, with a maximum width J1, electrically connecting to the first pad;
   a plurality of second solder joints, respectively with a maximum width J2 and J2>J1, respectively electrically connecting to the second pads; and
   an electronic device comprising a plurality of third pads, the third pads being arranged substantially corresponding to the openings and electrically connecting to the first and second solder joints respectively.

2. The structure as claimed in claim 1, wherein a ratio of J2 to J1 (J2/J1) is between 1.05 and 1.50.

3. The structure as claimed in claim 2, wherein a ratio of J2 to J1 (J2/J1) is substantially 1.17.

4. The structure as claimed in claim 1, wherein the first solder and second solder joints comprise tin-lead alloy, leaded tin-based alloy, or lead-free tin-based alloy.

5. The structure as claimed in claim 1, wherein the electronic device comprises a BGA (ball grid array) package, WLP (wafer level package), semiconductor chip for flip chip technology, or connector.

* * * * *